United States Patent

Baker et al.

[15] 3,689,803

[45] Sept. 5, 1972

[54] INTEGRATED CIRCUIT STRUCTURE HAVING A UNIQUE SURFACE METALLIZATION LAYOUT

[72] Inventors: Theodore H. Baker, Poughkeepsie; Daniel Tuman, Beacon, both of N.Y.

[73] Assignee: International Business Machines Corporation, Armonk, N.Y.

[22] Filed: March 30, 1971

[21] Appl. No.: 129,428

[52] U.S. Cl. ..............................317/101 A, 317/235

[51] Int. Cl. ..............................................H01l 19/00

[58] Field of Search .......................317/101 A, 235 E

[56] References Cited

UNITED STATES PATENTS

| | | | |
|---|---|---|---|
| 3,539,876 | 11/1970 | Feinberg et al. | 317/101 A |
| 3,265,905 | 8/1966 | McNeil | 317/235 E |
| 3,581,165 | 5/1971 | Seelbach | 317/235 E |
| 3,571,917 | 3/1971 | Merryman et al. | 317/235 E |

*Primary Examiner*—David Smith, Jr.
*Attorney*—Hanifin & Jancin and Julius B. Kraft

[57] ABSTRACT

A planar monolithic integrated circuit chip containing an isolation region of one conductivity type extending completely around the edge or periphery of the chip in order to insure that there are no exposed P-N junctions on an edge surface of the chip. Such an isolation region extends for at least a minimum distance from the edge of the chip, said distance being determined so as to minimize the risk of any edge defects in the chip resulting from dicing and handling from extending beyond the isolation region into the body of the chip. An insulative layer over the planar surface of the chip supports a metallization pattern for interconnecting the devices in the integrated circuit and for distributing a plurality of voltage supplys at different levels to the devices. The metallization pattern is arranged so that only metallization connected to the voltage supply at the same level as the peripheral isolation region is located on the portion of the insulative layer between the chip edge and the minimum distance of the isolation junction from the edge.

8 Claims, 3 Drawing Figures

PATENTED SEP 5 1972 3,689,803

SHEET 1 OF 2

INVENTORS
THEODORE H. BAKER
DANIEL TUMAN

BY J. B. Kraft
ATTORNEY

INTEGRATED CIRCUIT STRUCTURE HAVING A UNIQUE SURFACE METALLIZATION LAYOUT

BACKGROUND OF THE INVENTION

The present invention relates to monolithic semiconductor planar integrated circuit structures which may be master slices, and is particularly directed to the arrangement of the interconnecting metallization with respect to regions in the substrate.

Planar integrated semiconductor circuits, in general, comprise a plurality of active and passive devices formed at the planar surface of a semiconductor member which may conventionally be a semiconductor substrate supporting an epitaxial layer containing the planar surface. Since all the P-N junctions in the integrated circuit extend from the planar surface, this planar surface is completely covered by a layer of insulative material such as silicon dioxide in order to prevent exposure of the P-N junctions to the ambient which would probably render the integrated circuit inoperative. On the surface of the insulative layer, there is a metallization pattern for interconnecting the devices in the circuit and for distributing to selected points in the circuit a plurality of voltage levels respectively from a plurality of voltage supplies. This metallization pattern is connected to the appropriate devices in the integrated circuit means of electrical contacts passing through openings in the insulative layer. Where there is provided in the chip an excess number of active and passive devices and these are to be selectively utilized by varying the metallization pattern to tailor the integrated circuit to particular needs such a structure is known as the master slice. Integrated circuits of the type described and appropriate methods for the fabrication thereof are described in U.S. Pat. No. 3,539,876.

In order to prevent the possible exposure of a P-N junction along edge surfaces of the chip, an isolation region has been used. Such an isolation region extends completely around the edge of the chip for at least a minimum distance which is determined by the distance an edge defect in the chip resulting from handling and usually from dicing may extend from the edge into the chip. This minimum distance is most desirably beyond the point to which such edge defects may extend.

While the peripheral isolation region substantially solves the problem of exposure of P-N junctions by edge defects, such edge defects are capable of causing another significant type of problem. An edge defect, such as a dent, is capable of damaging the insulation layer on the planar surface at the edge of the chip so that the metallization on the damaged insulation layer is shorted to the isolation region since this isolation region extends throughout the chip, such a short is likely to render the entire chip ineffective.

SUMMARY OF THE INVENTION

Accordingly, the primary object of the present invention to provide a planar semiconductor integrated circuit chip structure in which the effects of edge defects are minimized.

Another object of the invention is to provide a planar integrated circuit chip structure in which damage to the planar surface insulation layer by edge defects does not affect the chip.

It is a further object of the present invention to provide a planar semiconductor integrated circuit chip structure having a novel surface metallization pattern whereby the chip is unaffected by edge defects which short the metallization pattern to the underlying semiconductor chip.

It is yet another object of the present invention to provide an integrated circuit master slice chip structure in which the effects of edge defects are minimized.

It is an even further object of the present invention to provide a planar semiconductor integrated circuit chip structure in which the effects of edge defects is minimized and in which a maximum of the planar surface area is utilized for surface metallization.

The present invention represents an improvement in planar semiconductor integrated chip structures in which a plurality of regions of different conductivity types extend from the planar surface into the chip to provide the active and passive devices of the integrated circuit. A layer of insulative material covers the planar surface and a plurality of electrical contacts extend through openings in the insulative layer respectively to the previously described regions. A metallization pattern is formed on the insulative layer which in addition to interconnecting the devices in the circuit also connects each of a plurality of voltage supplies having different voltage levels respectively to different regions through the contacts.

The improvement of the present invention resides in the combination of an isolation region of one conductivity type extending from the planar surface around the edge of the chip and forming P-N isolation junctions with abutting regions of opposite type conductivity which enclose the devices in the circuit. The isolation junctions must be spaced a predetermined minimum distance from the edge of the chip; this minimum distance is selected so that the possibility of edge defects from dicing or handling reaching an isolation junction located at the minimum distance is substantially nil. One of the voltage supplies is applied to the isolation region. The combination also includes a unique metallization pattern on the insulative layer wherein only metallization connected to the voltage supply already applied to the isolation region is located on the portion of the insulative layer between the edge of the chip and the minimum distance of the isolation junction from the edge.

The structure of the present invention, in addition to providing a peripheral isolation region which prevents exposure of P-N junctions, also remains unaffected by any damage to the insulative layer caused by such edge defects. At worst, such damage to the insulative layer will merely short to the peripheral isolation region, the peripheral metallization which is already at the same voltage level as the isolation. Such a short will have no effect.

By such an arrangement of the metallization pattern with respect to the peripheral isolation region, the structure of the present invention achieves maximum utilization of the planar surface area for metallization in addition to solving the problem of electrical shorts through the peripheral insulative layer. With the ever-increasing micro-miniaturization of integrated circuits and the attendant increase in density of devices per unit area, it becomes highly desirable that a maximum utilization of all planar surface area be achieved for the metallization pattern. Unless the structure of the present invention is utilized, the area of the planar surface between the edge of the chip and the minimum distance required for isolation would be wasted. Metallization could not be randomly placed in this area without the problem of electrical shorts rendering the integrated circuit chip ineffective.

The foregoing and other objects, features and advantages of the invention will be apparent from the following more particular description and preferred embodiments of the invention as illustrated in the accompanying drawings.

DESCRIPTION OF PREFERRED EMBODIMENTS

Figure 1:
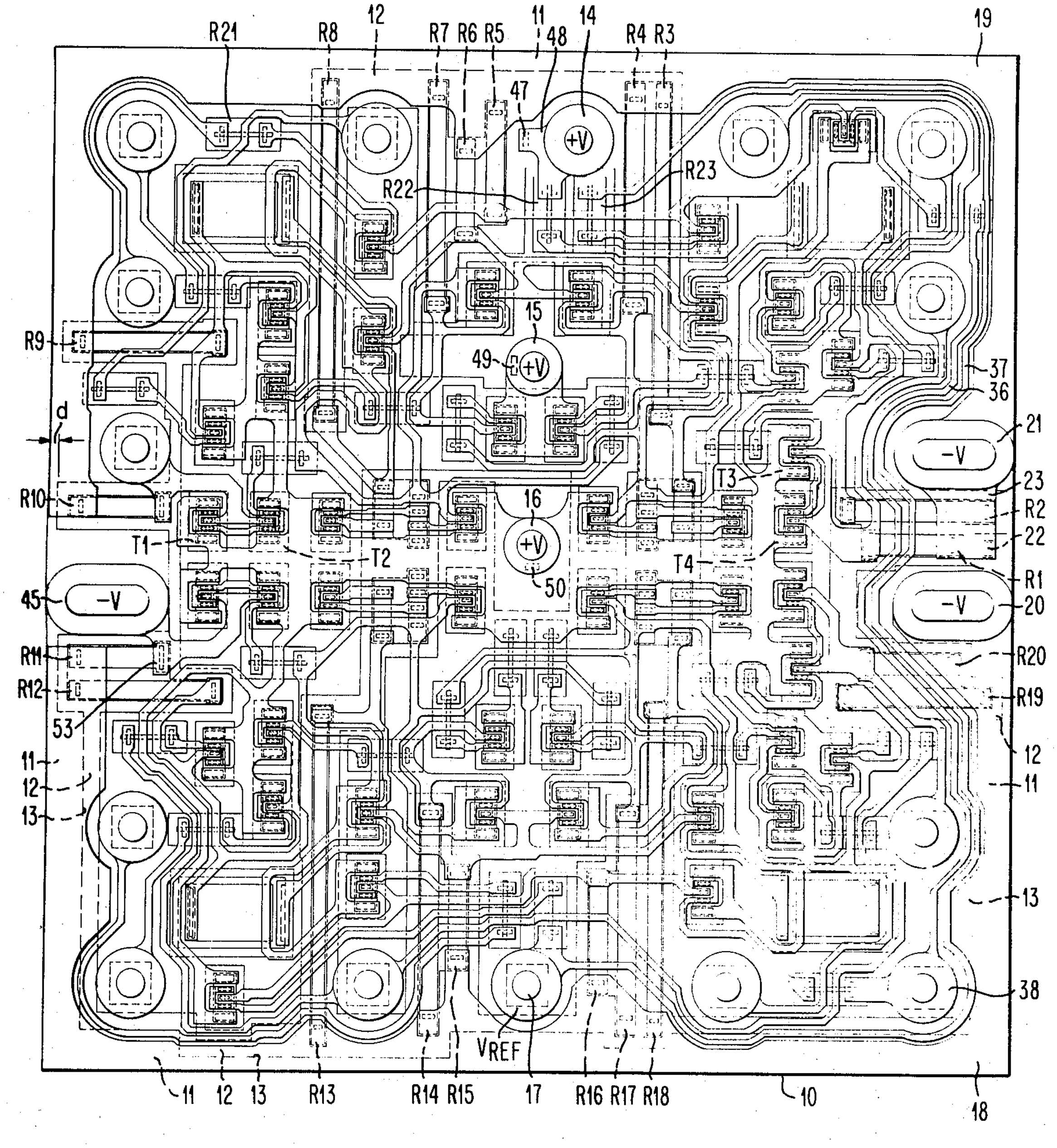
FIG. 1 is the top view of the planar surface of an integrated circuit chip in accordance with the present invention showing both the metallization pattern and the diffused regions forming the active and passive devices of he integrated circuit.

FIG. 1 is the top view of an integrated circuit chip in accordance with the present invention. In this view the metallization pattern is shown as well as all diffused regions which extend from the shown planar surface of the chip. The regions in the chip are formed by diffusion using conventional techniques and the insulative layer over the planar surface as well as the metallization pattern on said insulative layer may also be applied in the conventional manner. The integrated circuit chip may be fabricated in the manner described in U.S. Pat. No. 3,539,876.

With respect to FIG. 1, isolation region 11 extends around the entire edge 10 of the chip. Isolation region 11 is a P+ conductivity type region formed by diffusion into N type epitaxial region 12 which abutts isolation region 11 to form a P-N junction 13. This junction is an isolation junction which serves to isolate the devices within the integrated circuit from the edge of the chip. Isolation region 11 has a minimum width *d* which represents the minimum distance which an isolation junction 13 can be from the edge of the chip. This minimum distance is selected so as to insure that possible edge defects in the chip arising during dicing or handling of the chip will not extend to and thereby expose an isolation junction 13. In other words, distance *d* is beyond the point to which edge defects in the chip will ordinarily extend. The metallization pattern on the planar surface of the chip is separated from the chip proper by a layer of insulative material such as silicon dioxide. As will be explained hereinafter in greater detail, the metallization pattern is selectively joined to regions in the chip proper through electrical contacts passing through openings or holes in the insulative layer. In addition to interconnecting various regions in the devices in the chip, the metallization pattern serves to distribute voltage levels from three different voltage supplies throughout the chip.

Voltage supply —V is applied to the chip through three oblong peripheral pads designed —V. Voltage supply +V is applied to the chip by means of three pads: peripheral pad 14 designated +V and internal pads 15 and 16 A third voltage supply, $V_{Ref}$ is applied to the chip via peripheral pad 17. The chip is to be seated on a printed land pattern corresponding to the pad positions on the chip located on the surface of a ceramic module which is not shown. The chip is seated on a module in the manner shown and described in U.S. Pat. No. 3,539,876 ( FIGS. 18 and 19). The pads may be connected to the lands on the ceramic substrate in the manner described in U.S. Pat. No. 3,429,040.

The —V voltage supply is distributed by a metallization pattern containing a pair of peripheral bus bars 18 and 19 which extend from the —V supply pads 20 and 21. Bus bars 18 and 19 extend substantially around the whole periphery of the chip.

It should be here noted that all of the pads are located on the insulative layer and do not make direct contact with regions in the chip. Such contact is made by the metallization which extends to and from the pads. The P+ peripheral isolation region 11 is connected to the —V voltage supply from pad 21 by means of an electric contact formed in contact hole 22 connected to metallization segment 23 from —V pad 21. Thus, the P+ isolation region is at a voltage level of —V. Accordingly, should an edge defect such as a dent break the insulation layer at the edge of the chip and short peripheral bus bars 18 or 19 to the underlying P+ region, such a dent would not affect the performance of the integrated circuit because it would merely short the bus bar which has a voltage level of —V to the P+ isolation region in the substrate which already has a voltage level of —V.

Figures 2, 3:
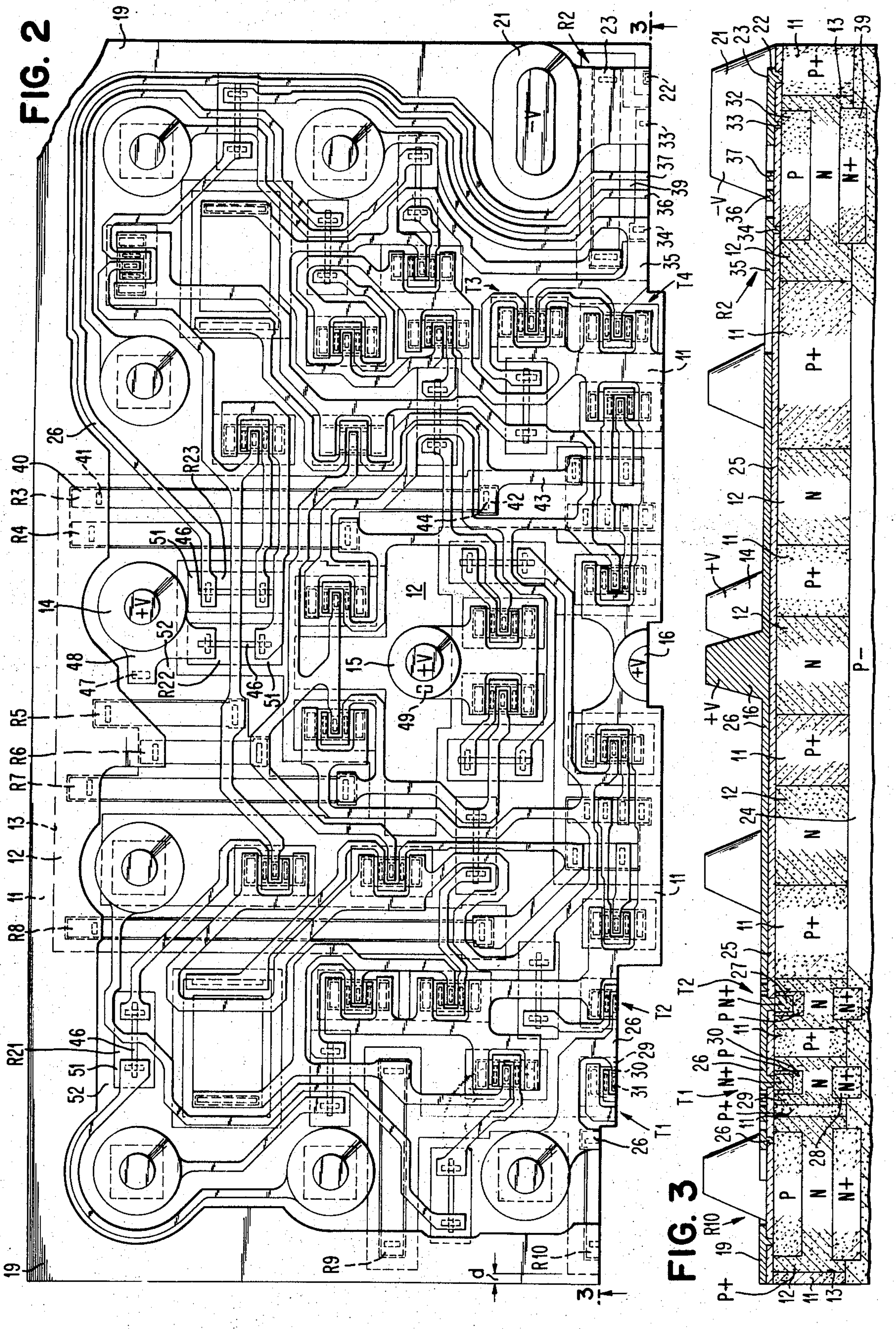
FIG. 2 is a more detailed view of the upper half of the planar surface shown in FIG. 1.
FIG. 3 is a cross-sectional view taken along line 3—3 in FIG. 2.

FIG. 2 is a more detailed view of the upper portion of the integrated circuit of FIG. 1 and FIG. 3 is a cross-section along lines 3—3 of FIG. 2. With reference to FIGS. 2 and 3, the integrated circuit comprises P— substrate 24 having formed thereon an N type epitaxial layer 12. Active and passive devices are formed in the epitaxial layer preferably by diffusion and are isolated from one another by P+ isolation region 11 which extend through the epitaxial region to the P— substrate, thus forming a plurality of pockets within which the active and passive devices are completely enclosed. A portion of the P+ isolation 11 extends completely around the periphery of the chip to provide the P+ peripheral isolation along the edge of the chip. The planar surface of the integrated circuit structure is insulated by layer 25 of an insulative material such as silicon dioxide. On the surface of insulative layer 25 is the metallization pattern 26 which acts to interconnect the devices in the integrated circuit and to distribute the voltage levels from the three voltages supplies, —V, +V, and $V_{Ref}$. The metallization pattern is connected to the regions in the substrate through metallic contacts formed in openings in insulative layer 25 such as opening 27.

The peripheral portion of P+ isolation region 11 varies in distance from the edge of the chip, depending, of course, upon the layout of the active and passive devices in the chip. However, it must extend for a minimum distance from the edge of the chip. This minimum distance is illustrated in FIG. 3 by the relatively thin isolation region 11 on the left side of the chip. This distance is determined so as to minimize chip failures due to edge defect reaching isolation junction 13. In other words, the minimum distance should be such that substantially no edge defects will reach and expose P-N junction 13. By way of example in a square chip whose sides have a length in the order of 50 mils, the P+ peripheral isolation region, should extend in the order of at least 1 to 4 mils from the edge of the chip, depending on the precision of the chip separation process used, e.g., dicing.

The cross-section in FIG. 3 is cut so as to illustrate examples of various devices in the chip. Transistors T1 and T2 typify the transistor structure. Each contains a buried N+ subcollector region 28, an N collector region 29, a P-base region 30 and an N+ emitter region 31.

Resistor R1, typifies the P type resistor array which is disposed around the periphery of the chip in order to provide means by which the −V voltage supply may be distributed to the interior portions of the chip. This resistor array provides paths of fixed resistance from the peripheral −V bus bar crossing under surface metallization at other voltage levels. With reference to resistor R1, it comprises a P type region 32 having one end connected to the peripheral −V supply through contact hole 33 to −V metallization segment 23 and an other end connected through contact hole 34 to metallization segment 35 which provides the −V voltage level to the emitters of a pair of transistors T3 and T4. In this fashion resistor R1 provides an underpass or cross-under for the −V voltage supply under metallization lines 36 and 37 which, with reference to FIG. 1, respectively are an output voltage to pad 38 and a $V_{Ref}$ voltage level from pad 17. N+ region 39 is a buried region beneath resistor R1. It should be noted that none of the chip pads, e.g., pad 21, makes direct contact to the semiconductor substrate immediately beneath the pad. Rather, the pads are connected to metallization such as bus bar 19 or metallization segment 23 which in turn are connected to the contacts with regions in the substrate. Metallization segment 23 contacts isolation region 11 through contact 22. This places the entire P+ isolation region at a −V voltage level.

The cross-under resistor array consists of a plurality of P type resistors, R1 through R20. The use of such a resistor array makes the −V peripheral bus bar arrangement of the present invention feasible in chips having a high metallization density. With reference to FIGS. 1 and 2, the resistor array R1 through R20 provides an under-pass extending from the peripheral −V bus bar to the interior portions of the planar surface. Each of resistors R1 through R20 have one end proximate the peripheral bus bars. For example, resistor R3 has one end 40 beneath bus bar 19. End 40 contacts bus bar 19 through contact hole 41. Resistor R3 then crosses under about eight lines of metallization where end 42 contacts metallization line 43 through contact hole 44.

The structure shown in the figures illustrates an integrated circuit which is substantially fully wired by the metallization pattern. However, it should be understood that the structure of the present invention may be readily used in a master slice merely by having a metallization pattern wherein the plurality of the active and passive devices in the substrate are not interconnected into the circuit. For example, one or more of the under-pass resistors R1 through R20 may be eliminated from the circuit merely by not forming a contact through an opening such as opening 41 to bus bar 19. In such a case, end 40 could still be under bus bar 19 but would be insulated from the bus bar by silicon dioxide insulative layer 26. Likewise, one or more of the approximately 45 transistors formed in the structure may also be eliminated merely by not forming any contacts between the metallization pattern and these transistors.

Primarily for purposes of illustration, the pads such as 14, 16, and 21 have been shown in FIG. 3 as generalized relatively uniform structures. Their preferable construction is that described in U.S. Pat. No. 3,539,876, at columns 18 and 19. The pads are formed of a lead-tin solder composition and are joined to the underlying metallization pattern by a composite of layers of chromium, copper, and gold. The metallization pattern from the pad to the various areas of the chip is preferably formed of aluminum. The three −V supply pads are oblong rather than round. This shape minimizes any potential problem resulting from the high current passing through these pads. We have found that where round pads are used for such high currents, the current density at the leading edge of the pads becomes excessive. Such high current density regions may cause some electromigration of the pad metal which in turn may result in shorts or corrosion problems. The oblong pads shown avoid this problem by presenting an elongated leading edge of the pad in the direction of the current flow. This reduces the current density at this leading edge. As a further expedient toward the elimination of high current density and current crowding, three pads have been used for the −V voltage supply instead of the single pad. Pads 20 and 21 are respectively connected to peripheral bus bars 18 and 19 while −V pad 45 is connected to metallization segment 53.

For similar reasons the −V voltage supply is distributed by means of three pads, 14, 15, and 16 instead of a single pad. The greater number of pads for V+ supply distribution also acts to minimize current crowding and high current density which tends to result in electromigration of metal. In addition, the use of internal pads 15 and 16 to a +V supply distribution reduces the amount of surface metallization necessary to distribute +V supply to interior portions of the chip surface. Pads 14, 15, and 16 are connected to the same metal land on the surface of the module (not shown) on which the chip is mounted. Because the module land has a finite resistance, we have found that the levels of the +V supply at pads 14, 15 and 16 tends to differ slightly from one another, apparently due to the voltage drops resulting from the resistance of the land pattern on the module joining these three pads. In order to compensate from these voltage differences, we have connected each of pads 14, 15 and 16 to the N type body of the epitaxial layer; pad 14 is joined to epitaxial layer 12 by means of contact 47 in metallization segment 48, pad 15 is connected to epitaxial layer 12 by contact 49, and pad 16 is joined to the epitaxial layer by contact 50. Accordingly, by means of contacts 47, 49 and 50, the three +V pads are connected to the epitaxial bed 12 which in effect provides a second current path between the +V pads which is parallel to the land pattern on the module joining these +V pads. This compensates for the previously mentioned voltage differences between these three +V pads. It should be noted that in the operation of the integrated circuit, the +V voltage supply is connected to N type areas such as collector regions or the N type epitaxial layer proper.

As a further expedient to insure uniform heat distribution throughout the integrated circuit chip and to avoid "hot spots," i.e., areas of the chip subject to localized higher heating, all of the resistor devices in the chip, and particularly, the peripheral array of 20 resistors R1 through R20 are arranged so as to be as evenly distributed throughout the chip as possible. Accordingly, the array contains six resistors, R3 through R8 extending from the upper edge of the chip, FIG. 1, and an opposite six resistors R13 through R18 extending from the bottom edge of the chip, four resistors R9 through R12 extending from the left hand edge of the chip and an opposite four resistors R19, R20, R1 and R2 extending from the right hand edge of the chip.

In addition to the P type resistors used for the distribution of the −V voltage supply, the chip further includes another type of under-pass resistor used primarily in the +V and $V_{Ref}$ voltage distribution system as well as the combination with metallization which interconnects devices on the chip. These resistors such as resistors, R21, R22, and R23 consist of an N+ under-pass diffusion 46 in an N-type bed 51 surrounded by P+ isolation 52.

While the invention has been particularly shown and described with reference to a preferred embodiment thereof, it will be understood by those skilled in the art that various changes in form and details may be made therein without departing from the spirit and scope of the invention.

What is claimed is:

1. In a planar semiconductor integrated circuit chip structure comprising a planar surface from which a plurality of regions of different conductivity types extend into the chip to provide the active and passive devices of the circuit, a layer of insulative material covering said surface, a plurality of electrical contacts extending through openings in said insulative layer respectively to said regions, and a metallization pattern formed on said insulative layer respectively connecting each of a plurality of voltage supplies having different levels to different regions through said contacts, the improvement comprising the combination of:

an isolation region of one conductivity type extending from said planar surface around the edge of the chip and regions of opposite type conductivity abutting said isolation region and more inward from said edge than said isolation region to form a P-N isolation junction surrounding the devices in the circuit, said isolation junctions being spaced from said edge by at least a predetermined minimum distance, means for applying the level of one of said plurality of voltage supplies to said isolation region, and a metallization pattern on said insulative layer wherein only metallization connected to the voltage supply at the same voltage level as said isolation region is located on the portion of the insulative layer between said edge and said minimum distance of said isolation junction from said edge.

2. The integrated circuit chip of claim 1 wherein said chip comprises a semiconductor substrate of the same conductivity type as said isolation region and an epitaxial layer having said planar surface on said substrate, and said isolation region is in said epitaxial layer.

3. The integrated circuit chip of claim 1 wherein said metallization at the same voltage level as the isolation is arranged on said edge portion of the insulative layer as at least one bus bar along said edge portion.

4. The integrated circuit chip of claim 3 wherein said at least one bus bar is a pair of bus bars around the edge of said insulative layer.

5. The integrated circuit chip of claim 1 wherein said chip is a master slice structure having an excess number of said active and passive devices, the selected integrated circuit being determined by the metallization pattern and the number and disposition of said electrical contacts.

6. The integrated circuit of claim 5 wherein said metallization at the same voltage level as the isolation is arranged on said edge portion of the insulative layer as at least one bus bar along said edge portion.

7. The integrated circuit of claim 6 wherein said at least one bus bar is a pair of bus bars around the edge of said insulative layer.

8. The integrated circuit of claim 3 wherein the metallization is arranged so as to include a plurality of lines spaced inwardly of said bus bar and each other and disposed in the same direction as said bus bar, said plurality of regions includes an array of regions of selected conductivity type and resistivity disposed substantially normal to the edge of the chip and passing under said plurality of spaced metallization lines, each of regions having one end proximate said bus bar and another end inwardly of said spaced metallization lines, and a plurality of said arrayed regions being selectively connected to said bus bar by electrical contacts through the insulative layer to the proximate ends of said regions and having electrical contacts to their other ends whereby underpass paths of fixed resistance from the bus bar are provided to connect the voltage level of the bus bar to inward portions of the chip surface.

* * * * *